United States Patent
Shiota et al.

[11] Patent Number: 6,111,628
[45] Date of Patent: Aug. 29, 2000

[54] LIQUID CRYSTAL DISPLAY DEVICE INCLUDING PLURAL BUMP ELECTRODES

[75] Inventors: Motoji Shiota, Kashihara; Kiyoshi Inada, Joyo; Hirokazu Yoshida, Osaka, all of Japan

[73] Assignee: Sharp Kabushiki Kaisha, Osaka, Japan

[21] Appl. No.: 09/035,063

[22] Filed: Mar. 5, 1998

[30] Foreign Application Priority Data

Mar. 6, 1997 [JP] Japan .................................. 9-052152

[51] Int. Cl.$^7$ .................................................. G02F 1/1345
[52] U.S. Cl. .................................................. 349/150; 349/149
[58] Field of Search .................................. 349/149, 150; 257/778, 779

[56] References Cited

U.S. PATENT DOCUMENTS

| | | | |
|---|---|---|---|
| 4,949,224 | 8/1990 | Yamamura et al. | 361/412 |
| 4,963,002 | 10/1990 | Tagusa et al. | 349/149 |
| 5,016,986 | 5/1991 | Kawashima et al. | 350/339 |
| 5,422,516 | 6/1995 | Hosokawa et al. | 257/775 |
| 5,576,869 | 11/1996 | Yoshida | 349/149 |
| 5,608,559 | 3/1997 | Inada et al. | 349/149 |
| 5,615,031 | 3/1997 | Saiuchi et al. | 349/149 |
| 5,666,270 | 9/1997 | Matsuda et al. | 361/704 |
| 5,777,391 | 7/1998 | Nakamura et al. | 257/778 |
| 5,897,337 | 4/1999 | Kata et al. | 438/114 |
| 6,016,013 | 1/2000 | Baba | 257/778 |

FOREIGN PATENT DOCUMENTS

| | | |
|---|---|---|
| 0 422 906 a1 | 4/1991 | European Pat. Off. . |
| 0 514 723 A1 | 11/1992 | European Pat. Off. . |
| 360224247 | 11/1985 | Japan . |
| 1-215034 | 8/1989 | Japan . |
| 3-56136 | 5/1990 | Japan . |
| 3-84929 | 4/1991 | Japan . |
| 5-13418 | 1/1993 | Japan . |
| 07058112 | 3/1995 | Japan . |
| 7-58112 | 3/1995 | Japan . |
| 409293755 | 11/1997 | Japan . |

OTHER PUBLICATIONS

Patent Abstracts of Japan, vol. 011, No. 049 (P–547), Feb. 14, 1987 & JP 61 215528 A (Matsushita Electric Ind Co Ltd), Sep. 25, 1986.

Patent Abstratcs of Japan, vol. 013, No. 181 (E–750), Apr. 27, 1989 & JP 01 008647 A (Toshiba Corp), Jan. 12, 1989.

Takeda et al, Fine Pitch Tab Technology with Straight Side Wall Bump Structure for LCD Panel, IEEE Transactions on Consumer Electronics, vol. 35, No. 3, Aug. 1, 1989, pp. 343–350.

*Primary Examiner*—William L. Sikes
*Assistant Examiner*—Tarifur R. Chowdhury
*Attorney, Agent, or Firm*—Nixon & Vanderhye P.C.

[57] ABSTRACT

A liquid crystal display device according to the present invention includes a substrate provided with a line pattern, and a circuit element electrically connected to the line pattern via a conductive layer. The line pattern has at least one bonding pad. The circuit element has at least one electrode pad. The at least one electrode pad has a plurality of bump electrodes provided thereon. The at least one electrode pad is electrically connected to the at least one bonding pad via the conductive layer which is provided between the plurality of bump electrodes and the bonding pad facing the plurality of bump electrodes, where the conductive layer is an insulative material having conductive particles dispersed throughout.

12 Claims, 9 Drawing Sheets

LIQUID CRYSTAL DISPLAY DEVICE INCLUDING PLURAL BUMP ELECTRODES

BACKGROUND OF THE INVENTION

1. Field of the Invention

The present invention relates to a liquid crystal display device, more specifically a liquid crystal device including a substrate provided with a line pattern, and a circuit element connected to the line pattern.

2. Description of the Related Art

A liquid crystal display device includes a liquid crystal display panel which includes a pair of substrates and a liquid crystal layer interposed therebetween. The liquid crystal display device further includes a circuit element such as a driver IC (Integrated Circuit) which is mounted on the liquid crystal display panel for driving the liquid crystal display panel. Conventionally, a TCP (Tape Carrier Package) technique is known as a general technique for mounting the driver IC on the liquid crystal display panel. Recently, in view of low cost, high reliability, capability of producing thin products and the like, a COG (Chip On Glass) technique is receiving attention. According to the COG technique, the driver IC for driving the liquid crystal display panel is bear-chip mounted on the liquid crystal display panel. Generally, a protrusion-like bump is formed on each electrode of the driver IC so that the driver IC is electrically connected to the liquid crystal display panel at the protrusion-like bumps in a face-down bonding manner. In this case, the bump electrodes are made of solder which are later melted for connection to the liquid crystal display panel. Alternatively, the bump electrodes are made of a metal such as Au which are later connected to the liquid crystal display panel by a conductive paste or an anisotropic conductive adhesive, e.g., an insulative adhesive having conductive particles dispersed throughout.

FIG. 9 is a cross-sectional view showing a conventional liquid crystal display device 300. FIG. 10 is a partially enlarged view of a portion 50C in FIG. 9, where an electrode pad 4 is seen toward a direction along an aligning direction thereof (hereinafter, simply referred to as "an aligning direction of the electrode pads") (the rest of the electrode pads 4 are hidden behind the electrode pad 4 as shown in FIG. 10).

Hereinafter, the conventional liquid crystal display device 300 will be described in which a liquid crystal display panel 3 and a driver IC 1 for driving the liquid crystal display panel 3 are connected in a face-down bonding manner by an anisotropic conductive adhesive 2.

Referring to FIG. 10, the plurality of electrode pads 4 (the rest of the electrode pads 4 are hidden behind the electrode pad 4 in FIG. 10) are formed on the surface of the driver IC 1. Each electrode pad 4 is provided with one protruding-like bump electrode 5. One of a pair of substrates 3a and 3b, i.e., the substrate 3a, is provided with a plurality of bonding pads 6 corresponding to the respective electrode pads 4.

FIG. 11 is a cross-sectional view showing the conventional liquid crystal display device 300 seen toward a direction indicated by an arrow 20 in FIG. 9. FIG. 12 is a partially enlarged view of one example of a portion 50D in FIG. 11, where the electrode pads 4 are seen toward a direction vertical to the aligning direction thereof.

Referring to FIG. 12, as described above, each of the plurality of electrode pads 4 and each of the plurality of bonding pad 6 are aligned so as to correspond with each other in a one-by-one manner. Each electrode pad 4 is provided with one bump electrode 5. The bump electrodes 5 and the bonding pads 6 are electrically connected to each other by an anisotropic conductive adhesive 2 which is an insulative adhesive 8 having conductive particles 7 dispersed throughout.

According to a method using the anisotropic conductive adhesive 2, the conductive particles 7 contained in the anisotropic conductive adhesive 2 are sandwiched between and make contact with the bump electrodes 5 of the driver IC 1 and the bonding pads 6 of the liquid crystal display panel 3, thereby providing electrical connection between the driver IC 1 and the liquid crystal display panel 3. This structure is advantageous, for example, in that the pitch of portions provided with electrical connection between the driver IC 1 and the liquid crystal display panel 3 depends only on the size of the bump electrodes 5, and in that the insulative adhesive 8 fills in the spaces between the adjacent bump electrodes 5 so as to advantageously provide sufficient insulation therebetween. Because of these advantages, the method using the anisotropic conductive adhesive 2 has become significant in the COG system.

In the above-described conventional liquid crystal display device, in order to realize a shorter pitch of the adjacent electrode pads 4 for the purpose of reducing the area required for mounting the driver IC 1, a shape of each electrode pad 4 is made into a rectangular shape or the like where minor sides of the electrode pads 4 are aligned along the aligning direction. Moreover, in order to realize a further shorter pitch of the adjacent electrode pads 4, the adjacent electrode pads 4 may be alternately offset in a direction vertical to the aligning direction of the electrode pads 4 so as to form a zigzag arrangement.

Referring to FIGS. 13A and 13B, the bump electrodes 5 of the conventional liquid crystal display device 300 are formed as follows. First, a photoresist 100 is applied on the driver IC 1 which is provided with the plurality of electrode pads 4. The photoresist 100 is provided so as to be about several $\mu$m to about 5 $\mu$m thicker than the thickness of the bump electrodes 5 to be formed. As shown in FIG. 13A, the photoresist 100 is exposed to light and developed so as to leave openings where the bump electrodes 5 are to be formed. The openings are formed so that an opening corresponds to one electrode pad 4. Then, the surface of the driver IC 1 with the photoresist 100 is immersed in a plating solution (e.g., of Au). A suitable amount of current is flowed between an electrode immersed in the plating solution and the driver IC 1, such that Au is deposited in the openings as shown in FIG. 13B. After the plating, the photoresist 100 is removed, thereby forming the bump electrode 5 on each electrode pad 4.

However, the bump electrodes 5 formed as described above have problems such as failure in growing the plating which depends on the conditions of the openings in the photoresist 100 or the conditions of the plating solution itself. This will result in loss or non-uniform heights of the bump electrodes 5. For example, the plating solution is circulated so that the openings are supplied with the plating solution. During the circulation, however, cavitation (i.e., bubbles) may be created which may block the openings and interrupt the growth (deposition) of the plating, and thereby cause a reduction in the height of the bump electrode 5. Furthermore, when a dust is present on a photomask during the light exposure of the photoresist 100, which rarely occurs, a sufficient amount of the opening may not be formed due to an insufficient exposure to light, thereby causing a loss of the bump electrode 5.

As shown in FIGS. 10 and 12, where there is no loss or non-uniform heights of the bump electrodes 5, the conductive particles 7 are sandwiched between and successfully made contact with the bump electrodes 5 and the bonding pads 6, thereby providing electrical connection therebetween.

FIG. 14 is a partial enlarged view of another example of the portion 50C in FIG. 9 where an electrode pad 4 is seen toward the aligning direction thereof (and the rest of the electrode pads 4 are hidden behind the electrode pad 4 shown in FIG. 14). FIG. 15 is a partial enlarged view of another example of the portion 50D in FIG. 11, where the electrode pads 4 are seen toward a direction vertical to the aligning direction thereof. In FIGS. 14 and 15, the conductive particles 7 are sandwiched between the bump electrodes 5 and the bonding pads 6 but do not make contact thereto, and thus, a current does not flow therebetween, thereby causing a connection failure.

SUMMARY OF THE INVENTION

According to one aspect of the present invention, a liquid crystal display device includes a substrate provided with a line pattern, and a circuit element electrically connected to the line pattern via a conductive layer. The line pattern has at least one bonding pad. The circuit element has at least one electrode pad. The at least one electrode pad has a plurality of bump electrodes provided thereon. The at least one electrode pad is electrically connected to the at least one bonding pad via the conductive layer which is provided between the plurality of bump electrodes and the bonding pad facing the plurality of bump electrodes, where the conductive layer is an insulative material having conductive particles dispersed throughout.

In one embodiment of the present invention, a space between the adjacent bump electrodes is about 5 µm or more.

In another embodiment of the present invention, a liquid crystal display device includes a plurality of electrode pads. Each of the plurality of electrode pads has major sides and minor sides. The plurality of electrode pads are aligned in a direction parallel to the minor sides of the electrode pads. The plurality of bump electrodes are aligned on each of the plurality of electrode pads in a direction parallel to the major sides.

In still another embodiment of the present invention, a liquid crystal display device includes a plurality of electrode pads. The plurality of electrode pads are arranged in a zigzag manner, and corners of the bump electrodes are cut such that a cut corner of the bump electrode on one electrode pad is generally parallel to a cut corner of the bump electrode on an adjacent electrode pad.

In still another embodiment of the present invention, surfaces of the plurality of the bump electrodes facing the bonding pad are arranged so as to be generally parallel to a surface of the bonding pad.

In still another embodiment of the present invention, a liquid crystal display device includes a plurality of electrode pads and the plurality of bonding pads facing the plurality of electrode pads. Electrical connection is provided between each of the plurality of bonding pads and a corresponding electrode pad via a single conductive layer made of an anisotropic conductive adhesive.

In still another embodiment of the present invention, the line pattern on the substrate and the circuit element are electrically connected to each other in a face bonding manner.

In still another embodiment of the present invention, the substrate is a glass substrate.

According to the present invention, a plurality of bump electrodes are provided on each of a plurality of electrode pads provided on a circuit element. Thus, even when one of the plurality of bump electrodes on one electrode pad does not have a predetermined height, for example, due to failure in growth of the plating, the rest of the bump electrodes will provide electrical connection between the electrode pad of the circuit element and the corresponding bonding pad of the liquid crystal display panel. In other words, the electrode pads of the circuit element and the bonding pads of the liquid crystal display panel are electrically connected as long as at least one of the plurality of the bump electrodes is properly formed. Thus, as understood from the foregoing, any one of the plurality of bump electrodes, if properly formed, is sufficient for completing an electrical connection, independently of any other of the plurality of bump electrodes, between the electrode pad and the bonding pad via the conductive layer.

Since the space between the adjacent bump electrodes on each electrode pad is about 5 µm or more, the adjacent bump electrodes are not short-circuited with each other during the plating growth. Thus, the bump electrodes are formed to be completely electrically isolated from each other.

In the case where the electrode pads are made, for example, into rectangular shapes in order to realize a shorter pitch thereof, such that the minor sides of the electrode pads are aligned along the aligning direction, the bump electrodes are preferably aligned on each electrode pad in a direction parallel to the major sides of the electrode pad. By doing so, a total area of the bump electrodes is sufficiently large, and thus, efficient.

Furthermore, in order to realize a further shorter pitch of the adjacent electrode pads, the adjacent electrode pads may be alternately offset in a direction vertical to the aligning direction of the electrode pads so as to form a zigzag arrangement. In this case, corners of the bump electrodes may be cut (so that the shapes of the bump electrodes are pentagonal, heptagonal or the like) such that a cut corner of the bump electrode on one electrode pad is generally parallel to a cut corner of the bump electrode of the adjacent electrode pad. Accordingly, a distance between the nearest bump electrodes may be sufficiently long to avoid shortcircuit between the adjacent bump electrodes even when the pitch of the electrode pads are decreased, thereby enhancing the reliability of electrical connection between the circuit element and the liquid crystal display panel. Alternatively, by providing the cut corners, instead of decreasing the pitch of the electrode pads, the area of each bump electrode may be increased.

Thus, the invention described herein makes possible the advantage of providing a liquid crystal display device in which no electrical connection failure is caused between electrode pads of a circuit element and bonding pads of the liquid crystal display panel.

This and other advantages of the present invention will become apparent to those skilled in the art upon reading and understanding the following detailed description with reference to the accompanying figures.

DESCRIPTION OF THE PREFERRED EMBODIMENTS

Figure 1:
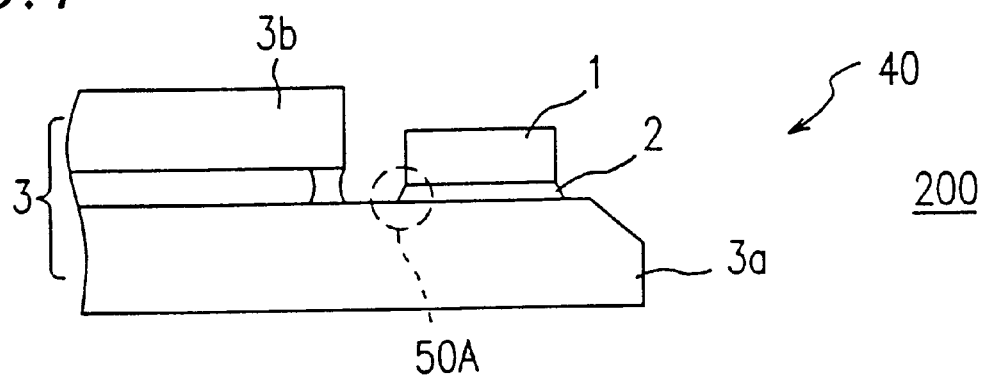
FIG. 1 is a cross-sectional view showing a liquid crystal display device according to the present invention which is mounted with an driver IC for driving a liquid crystal display panel.

Hereinafter, the present invention will be described by way of illustrative examples with reference to the accompanying drawings in which the same reference numerals designate the same component.

Figure 2:
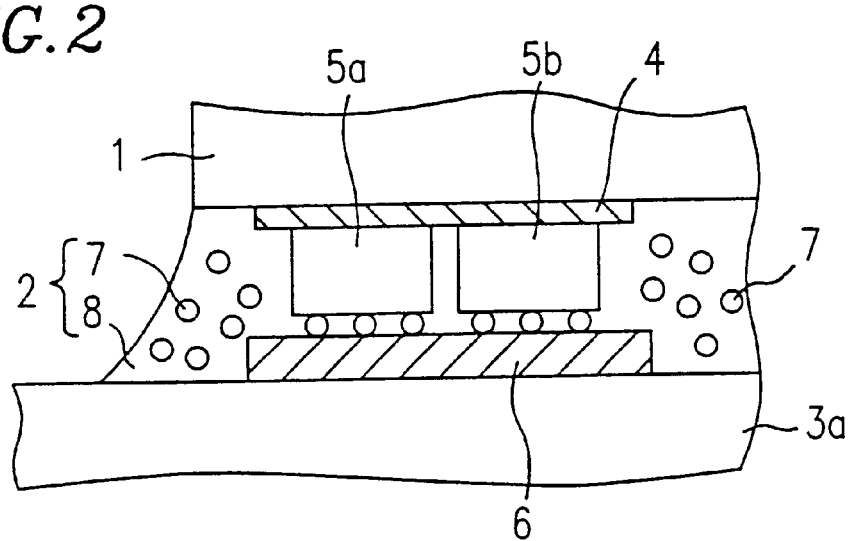
FIG. 2 is a partially enlarged view of a portion 50A in FIG. 1.

FIG. 1 is a cross-sectional view showing a liquid crystal display device 200 according to the present invention which is mounted with a driver IC 1 for driving a liquid crystal display panel 3. FIG. 2 is a partially enlarged view of a portion 50A in FIG. 1, where an electrode pad 4 is seen toward an aligning direction thereof (the rest of the electrode pads 4 are hidden behind the electrode pad 4 shown in FIG. 2). The liquid crystal display device 200 includes a plurality of electrode pads 4 provided on a surface of the driver IC 1. Each of the electrode pads 4 is provided with bump electrodes 5a and 5b made of a metal such as Au aligned in a direction vertical to the aligning direction of the electrode pads 4. A substrate 3a (which is one of a pair of substrates 3a and 3b of the liquid crystal display panel 3) is provided with a plurality of bonding pads 6 which correspond to the respective electrode pads 4 on the driver IC 1.

Figure 3:
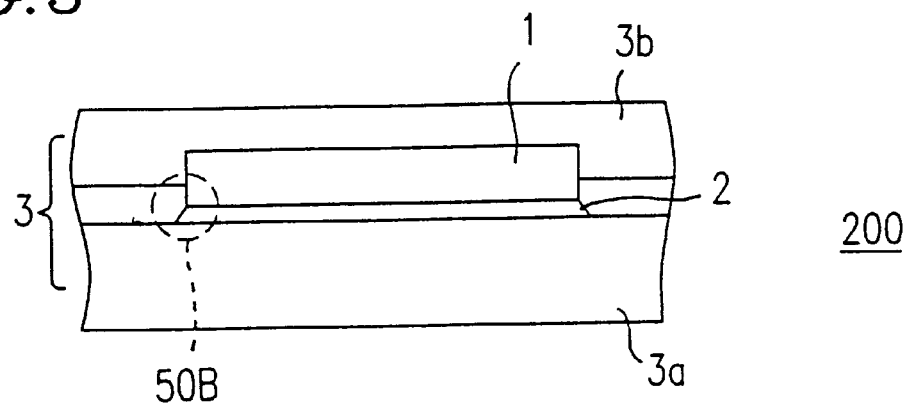
FIG. 3 is a cross-sectional view showing the liquid crystal display device according to the present invention seen toward a direction indicated by an arrow 40 in FIG. 1.
Figure 4:
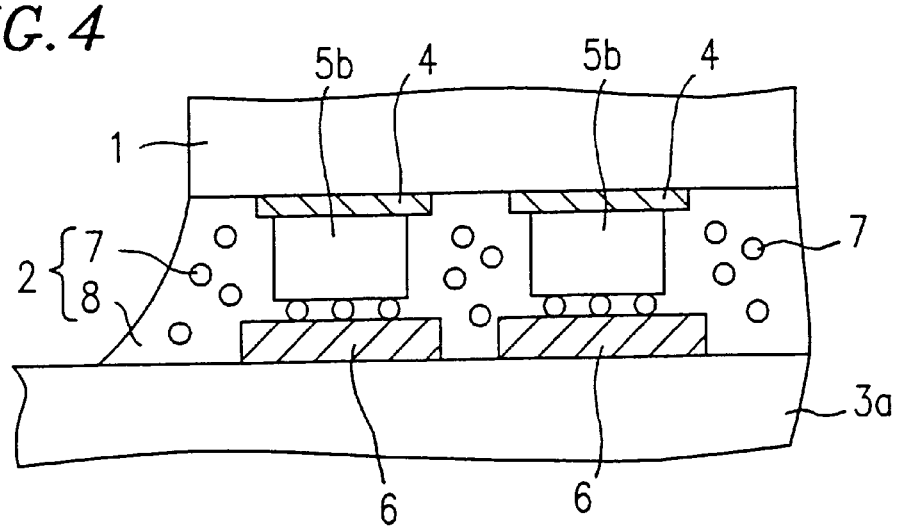
FIG. 4 is a partially enlarged view of a portion 50B in FIG. 3.

FIG. 3 is a cross-sectional view showing the same liquid crystal display device seen toward a direction indicated by an arrow 40 in FIG. 1. FIG. 4 is a partially enlarged view of a portion 50B in FIG. 3, where the electrode pads 4 are seen toward a direction vertical to the aligning direction thereof.

As shown in FIG. 4, the plurality of electrode pads 4 and the plurality of bonding pads 6 are aligned so as to correspond with each other in a one-by-one manner. As described above, the bump electrodes 5a and 5b (where the bump electrodes 5a are hidden behind the bump electrodes 5b) are provided on each of the electrode pads 4. The bump electrodes 5a and 5b and the bonding pads 6 are electrically connected via an anisotropic conductive adhesive 2, e.g., an insulative adhesive 8 having conductive particles 7 dispersed throughout. The conductive particles 7 contained in the anisotropic conductive adhesive 2 are sandwiched between and make contact with the bump electrodes 5a and 5b and the bonding pads 6, thereby providing electrical connection between the electrode pads 4 of the driver IC 1 and the bonding pads 6 of the liquid crystal display panel 3.

According to the present invention, the anisotropic conductive adhesive 2 may be, but is not limited to, an epoxy ACF (Anisotropic Conductive Film). Any commercially available ACFs may be used as the anisotropic conductive adhesive 2. According to the present invention, the conductive particles 7 have a particle size of about 3 $\mu$m. Conductive particles 7 with a particle size of about 5 $\mu$m may also be used. Preferably, a difference between the uneven heights of the bump electrodes 5 is about 3 $\mu$m or less, and more preferably about 1 $\mu$m or less. When the difference between the uneven heights of the bump electrodes 5 is more than 3 $\mu$m, the conductive particles dispersed in the anisotropic conductive adhesive may not be able to provide electrical connection between the bump electrodes 5 of the driver IC 1 and the bonding pads 6 of the liquid crystal display panel 3, thereby deteriorating connection reliability therebetween. The heights of the bump electrodes 5 may be measured by a conventional method such as a contact measurement using a probe or the like, a non-contact measurement utilizing focus of a microscope and a non-contact measurement using a laser displacement measuring device.

A difference between the uneven heights of the electrode pads is several tens of nanometers or less.

In FIGS. 2 and 4, there is no loss or non-uniform heights of the bump electrodes 5a and 5b. Therefore, the conductive particles 7 are sandwiched between and successfully make contact with the bump electrodes 5a and 5b and the bonding pads 6, thereby providing electrical connection between the electrode pads 4 of the driver IC 1 and the bonding pads 6 of the liquid crystal display panel 3.

Figure 5:
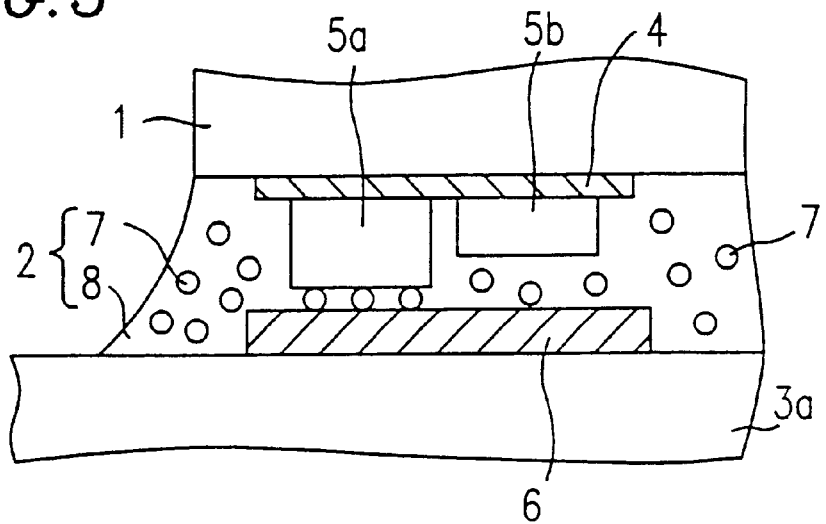
FIG. 5 is a partial enlarged view of another example of the portion 50A.
Figure 6:
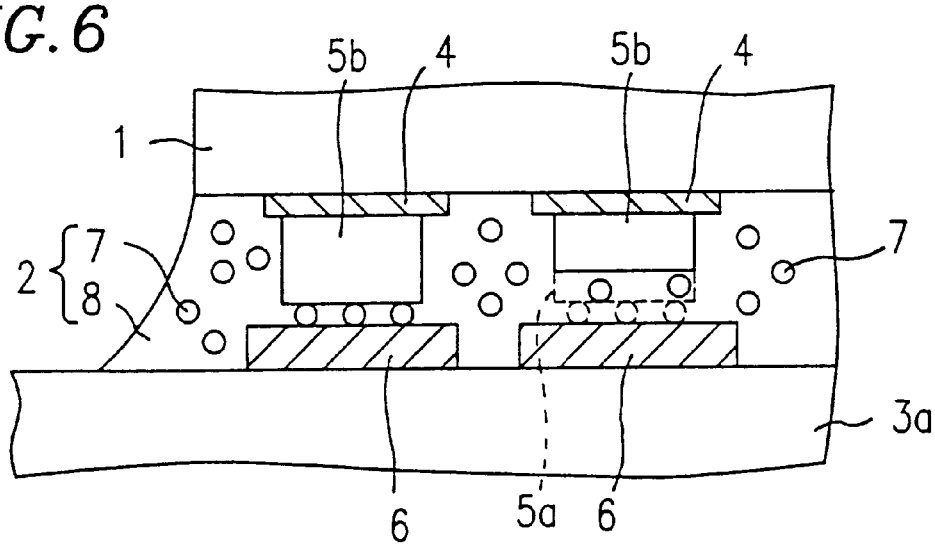
FIG. 6 is a partial enlarged view of another example of the portion 50B.

FIG. 5 is a partial enlarged view of another example of the portion 50A. FIG. 6 is a partial enlarged view of another example of the portion 50B.

According to the present invention, even in the case where either one of the bump electrodes 5a or 5b, for example, 5b, is lost or has a non-uniform bump height as shown in FIGS. 5 and 6, the driver IC 1 and the liquid crystal display panel 3 are still electrically connected to each other as long as the bump electrode 5a is formed properly (i.e., as long as at least one of the bump electrodes 5a and 5b is formed properly). In FIG. 5, the conductive particles 7 are sandwiched between and successfully make contact with the bump electrode 5a and the bonding pad 6, thereby electrically connecting the electrode pad 4 of the driver IC 1 to the bonding pad 6 of the liquid crystal display panel 3. Obviously, the same thing applies in the case where the bump electrode 5a is lost or has a non-uniform bump heights. In this case, as long as the bump electrode 5b is formed properly, the conductive particles 7 are sandwiched between and successfully make contact with the bump electrode 5b and the bonding pad 6 and electrically connects the electrode pad 4 of the driver IC 1 to the bonding pad 6 of the liquid crystal display panel 3.

Figure 7A:
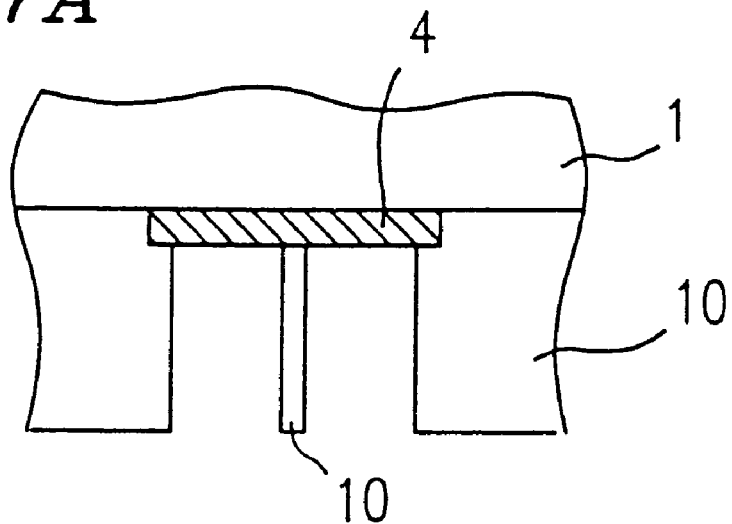
FIGS. 7A and 7B are schematic cross-sectional views each showing a step for producing bump electrodes of the liquid crystal display device 200 according to the present invention.
Figure 7B:
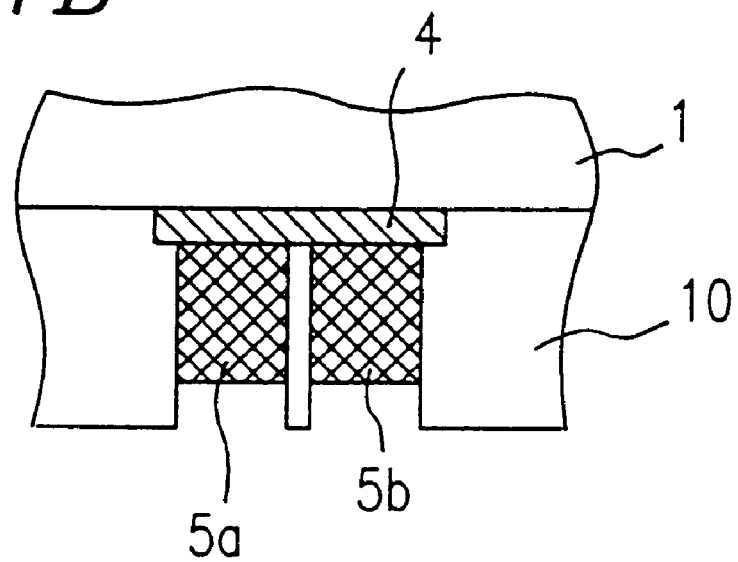

FIGS. 7A and 7B are schematic cross-sectional views each showing a step for producing the bump electrodes 5a and 5b of the liquid crystal display device 200 according to the present invention.

Referring to FIGS. 7A and 7B, the bump electrodes 5a and 5b of the liquid crystal display device 200 are formed as follows. First, a photoresist 10 is applied on the driver IC 1 which is provided with the plurality of electrode pads 4. The photoresist 10 is provided so as to be about several $\mu$m to about 5 $\mu$m thicker than the thickness of the bump electrodes 5a and 5b to be formed. The photoresist 10 is then exposed to light and developed so as to leave openings where the bump electrodes 5a and 5b are to be formed. As shown in FIG. 7A, each electrode pad 4 is provided with two openings corresponding to the bump electrodes 5a and 5b.

Then, the surface of the driver IC 1 with the photoresist 10 is immersed in a plating solution (e.g., of Au). A suitable amount of current flows between an electrode immersed in the plating solution and the driver IC 1, such that Au is deposited in the openings as shown in FIG. 7B. After the plating, the photoresist 10 is removed, thereby forming two bump electrodes 5a and 5b on each electrode pad 4.

According to the present invention, for example, two openings are provided in the photoresist 10 for each electrode pad 4. As a result, the rate of failure in growing both of the bump electrodes 5a and 5b, which is caused, for example, by bubbles filling the openings, as compared with that of the conventional method, is: (a rate of growth failure of the bump electrodes according to the conventional method)$^2 \times$(1/number of driver IC electrode pads of the liquid crystal display device according to the present invention). For example, under the conditions where the electrode pads of the driver IC according to the present invention consist of 240 terminals and a rate of failure in growing the bump electrodes according to the conventional method is 1%, a rate of failure in growing both of the bump electrodes 5a and 5b according to the present invention will be 0.01%×1/240, which is surprisingly low compared to the conventional liquid crystal display device.

According to the conventional liquid crystal display device, when a dust particle is present on a photomask during the light exposure of the photoresist, the opening is insufficient even when the size of the dust is half the size of the opening, which results in a loss of a bump electrode. On the other hand, according to the present invention, since the total area of the openings at each electrode pad 4 is larger than that of the conventional liquid crystal display device, a rate of failure in growing bump electrodes is lower.

Figure 8A:
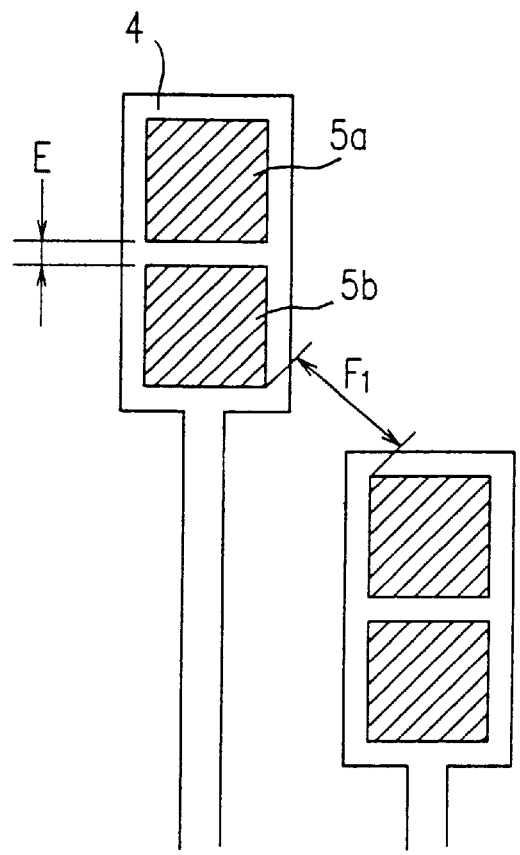
FIGS. 8A and 8B are plan views showing examples of arrangements of bump electrodes on the electrode pads according to the present invention.
Figure 8B:
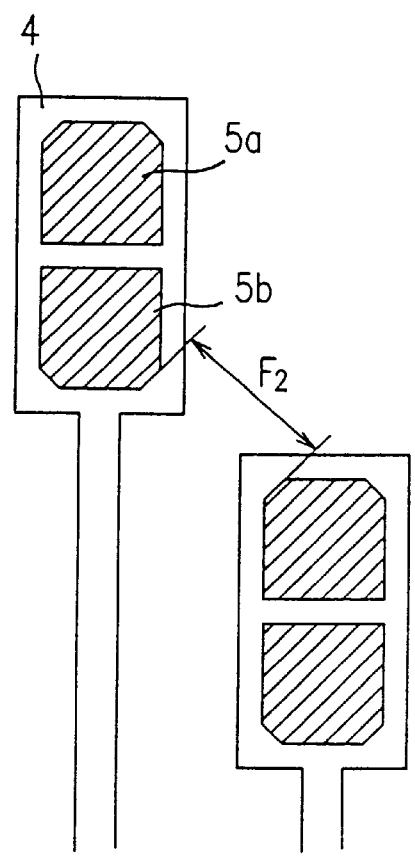
Figure 9:
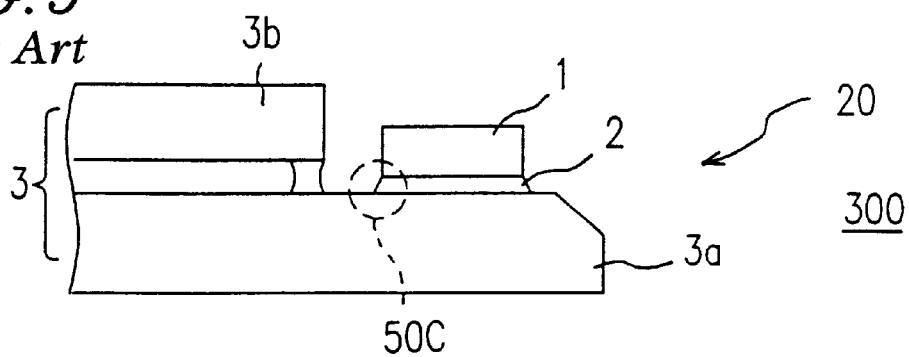
FIG. 9 is a cross-sectional view showing a conventional liquid crystal display device.
Figure 10:
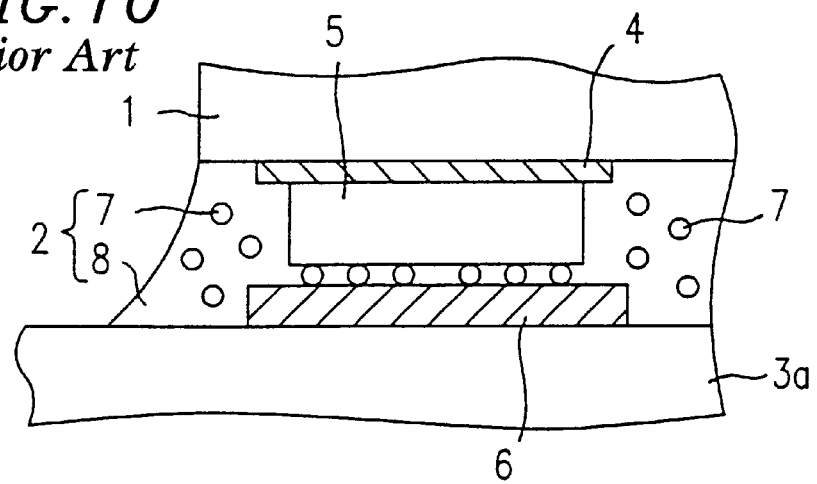
FIG. 10 is a partially enlarged view of a portion 50C in FIG. 9.
Figure 11:
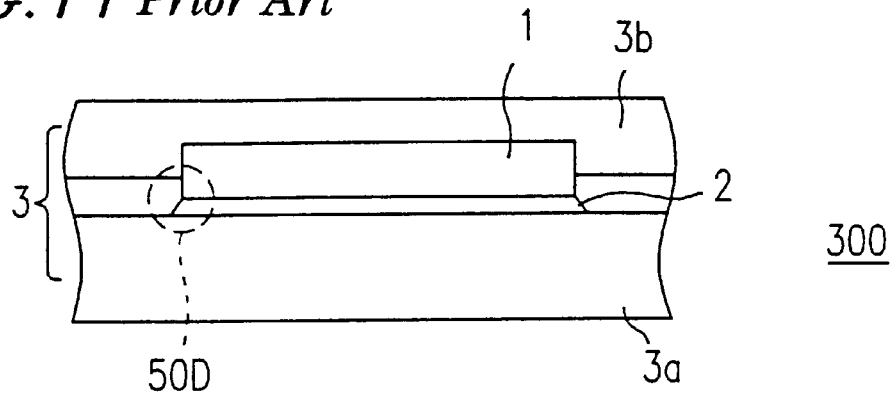
FIG. 11 is a cross-sectional view showing the conventional liquid crystal display device seen toward a direction indicated by an arrow 20 in FIG. 9.
Figure 12:
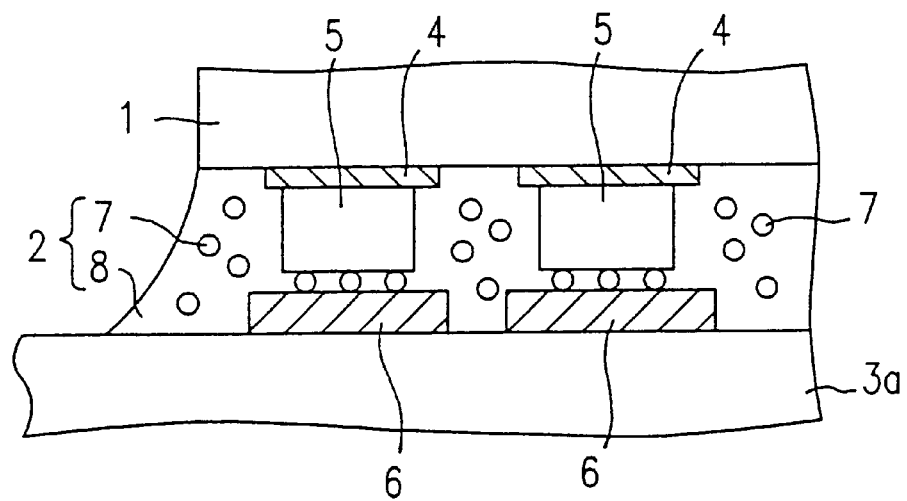
FIG. 12 is a partially enlarged view of one example of a portion 50D in FIG. 11.
Figure 13A:
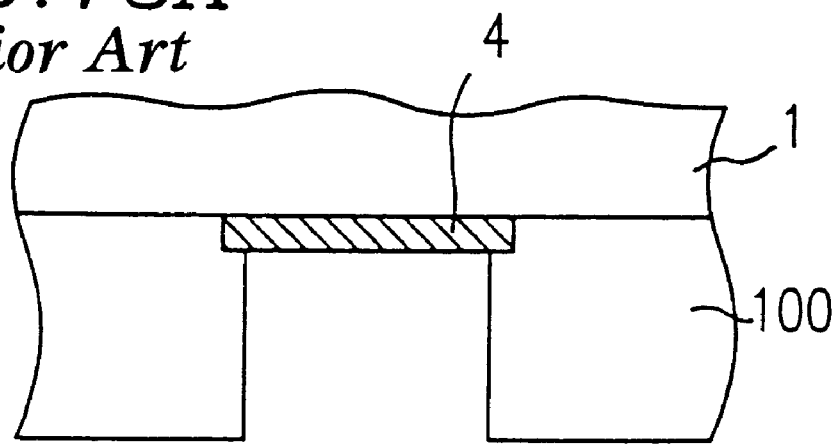
FIGS. 13A and 13B are schematic cross-sectional views each showing a step for producing bump electrodes in the conventional liquid crystal display device.
Figure 13B:
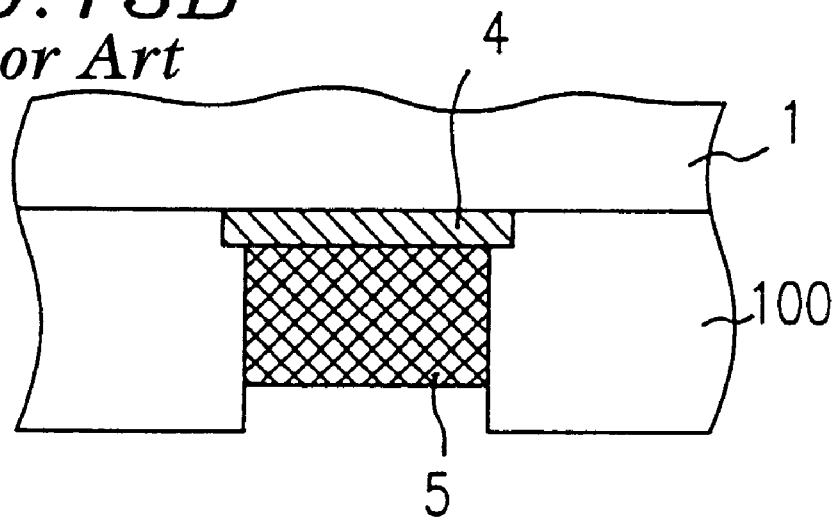
Figure 14:
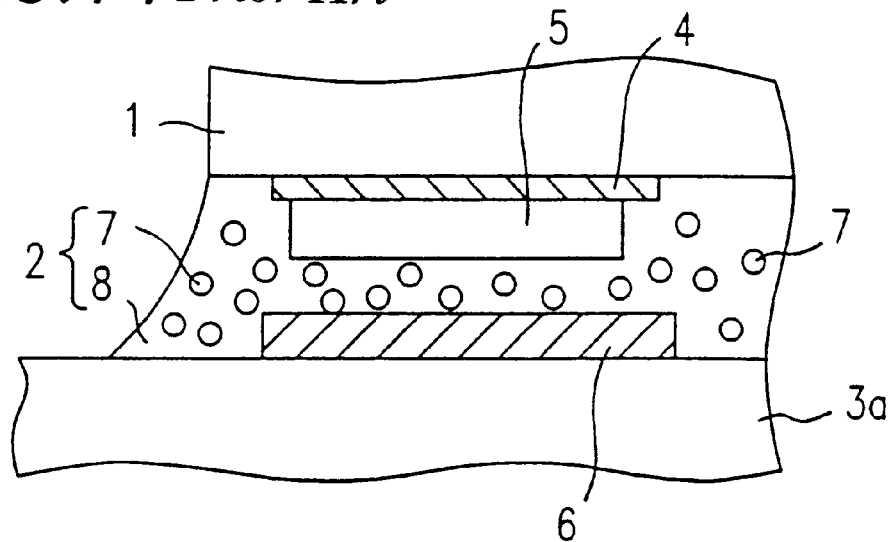
FIG. 14 is a partial enlarged view of another example of the portion 50C in FIG. 9.
Figure 15:
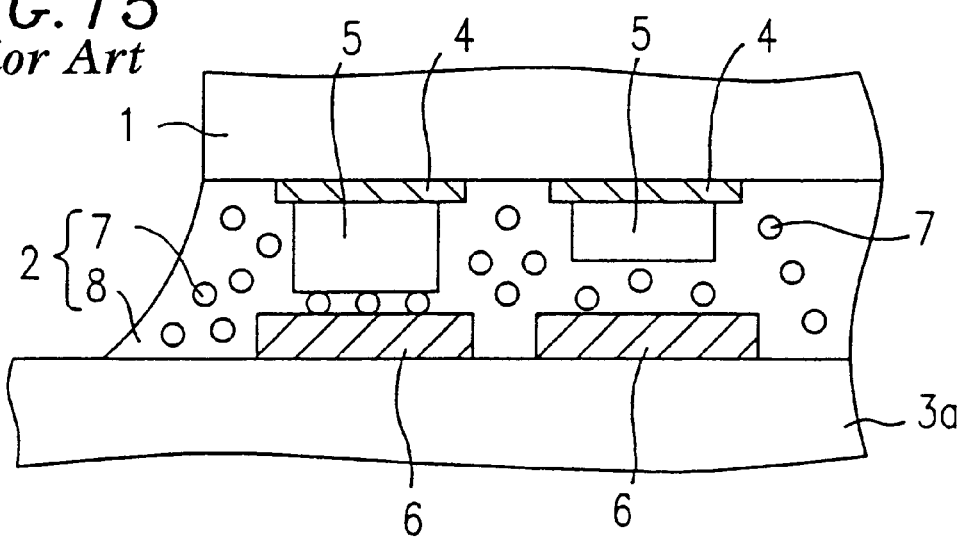
FIG. 15 is a partial enlarged view of another example of the portion 50D in FIG. 11.

FIGS. 8A and 8B are plan views showing examples of arrangements of the bump electrodes 5a and 5b on the electrode pads 6.

As shown in FIG. 8A, a space E between the adjacent bump electrodes 5a and 5b is made about 5 $\mu$m or greater so as to prevent a short-circuit to be caused therebetween during the step of plating. Thus, the electrodes 5a and 5b are formed completely electrically isolated from each other. When the space E between the adjacent bump electrodes 5a and 5b is not 5 $\mu$m or more, the resist used at the plating step for forming isolated bumps may not be formed properly. In this case, the resulting bump electrodes 5a and 5b may not be isolated from each other.

According to the liquid crystal display device of the present invention, in order to realize a shorter pitch of the adjacent electrode pads 4, the adjacent electrode pads 4 may be offset in a direction vertical to the aligning direction of the electrode pads 4 so as to form a zigzag arrangement as shown in FIGS. 8A and 8B. The shapes of the bump electrodes 5a and 5b may be quadrate as shown in FIG. 8A. Alternatively, as shown in FIG. 8B, the corners of the bump electrodes 5a and 5b may be cut (so that the shapes of the bump electrodes 5a and 5b are hexagonal) such that a cut corner of the bump electrode 5b on one electrode pad 4 is generally parallel to a cut corner of the bump electrode 5a on the adjacent electrode pad 4. As a result, a distance $F_2$ between the nearest diagonally located cut corners is longer than a distance $F_1$ shown in FIG. 8A, which is advantageous in that the occurrence of a short-circuit caused between the bump electrodes 5a and 5b is further reduced, which further improves the reliability of the liquid crystal display device. In addition, the areas of the bump electrodes 5a and 5b may be increased and made greater than the areas of the bump electrodes 5a and 5b shown in FIG. 8A by making the distance $F_2$ equal to the distance $F_1$ while remaining the shapes of the bump electrodes 5a and 5b of FIG. 8B, thereby enhancing the reliability of the electrical connection.

Alternatively, same effects are obtained when the corners of the bump electrodes 5a and 5b are cut such that the shapes thereof are pentagonal or heptagonal where a cut corner of the bump electrode 5b on one electrode pad 4 is generally parallel to a cut corner of the bump electrode 5a on the adjacent electrode pad 4.

According to the liquid crystal display device of the present invention, in order to realize a shorter pitch of the adjacent electrode pads 4 as shown in FIGS. 8A and 8B, a shape of each electrode pad 4 may be made into a rectangular shape where the minor sides of the electrode pads 4 are aligned along the aligning direction of the electrode pads 4. In this case, the bump electrodes 5a and 5b may be aligned on each electrode pad 4 in a direction vertical to the aligning direction of the electrode pads 4. However, the number and the location of the bump electrodes 5a and 5b are not limited thereto and may be suitably selected depending on the size of the electrode pads 6 of the driver IC 1.

According to the present invention, the liquid crystal display panel and the driver IC are electrically connected as long as at least one of the bump electrodes 5a or 5b on the electrode pad 4 is electrically connected to the corresponding bonding pad 6. The electrical connection between the liquid crystal display panel and the driver IC is further ensured by adjusting the size of the bump electrodes and a filling density of the conductive particles 7 in the anisotropic conductive adhesive 2, such that preferably at least four conductive particles are provided between each bump electrode of the driver IC and each corresponding bonding pad of the liquid crystal display panel.

In the above-described examples, the anisotropic conductive adhesive ACF is used. The present invention, however, is not limited thereto, and an isotropic conductive adhesive containing conductive particles may also be used. It is noted that ACF is advantageous in that electrical connection between a plurality of electrode pads and a plurality of bonding pads may be provided by only using a single ACF layer. This is favorable in mounting a bear-chip on a substrate in a face-down bonding manner.

According to the present invention, a substrate having a circuit element connected thereto which is connected to a glass substrate of a liquid crystal display device may be made of a material other than glass.

According to the present invention, a plurality of bump electrodes are provided on each of a plurality of electrode pads provided on a circuit element. These bump electrodes are used to provide electrical connection between each electrode pad on a circuit element and each respective bonding pad on a liquid crystal display panel. Even when one of the plurality of bump electrodes on one electrode pad is lost or does not have a predetermined height, for example, due to failure in growth of the plating, the rest of the bump electrodes will provide electrical connection between the electrode pad of the circuit element and the corresponding bonding pad of the liquid crystal display panel. In other words, the electrode pads of the circuit element and the bonding pads of the liquid crystal display panel are electrically connected unless all of the plurality of the bump electrodes fail to be formed properly.

Since the space between the adjacent bump electrodes on each electrode pad is about 5 μm or more, the adjacent bump electrodes are not short-circuited with each other during the plating growth. Thus, the bump electrodes are formed completely electrically isolated from each other, thereby further reducing the risk of connection failure.

In the case where the electrode pads are made, for example, into rectangular shapes in order to realize a shorter pitch thereof, such that the minor sides of the electrode pads are aligned along an aligning direction of the electrode pads, the bump electrodes are preferably aligned on each electrode pad in a direction vertical to the aligning direction of the electrode pads. Accordingly, a total area of the bump electrodes is increased, and thus, efficient.

Furthermore, the electrode pads on the circuit element may be formed in a zigzag arrangement in order to realize a further shorter pitch of the adjacent electrode pads. In this case, corners of the bump electrodes may be cut (so that the shapes of the bump electrodes are pentagon, heptagon or the like) such that a corner of the bump electrode on one electrode pad is generally parallel to a cut corner of the bump electrode on the adjacent electrode pad. Accordingly, a distance between the nearest bump electrodes may be increased, thereby enhancing reliability of electrical connection between the circuit element and the liquid crystal display panel. Alternatively, by providing the cut corners, the area of each bump electrode may be increased, thereby enhancing the reliability of the electrical connection between the circuit element and the liquid crystal display panel.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A liquid crystal display device, comprising a substrate provided with a line pattern, and a circuit element electrically connected to the line pattern via a conductive layer, wherein:

the line pattern has at least one bonding pad;

the circuit element has at least one electrode pad;

the at least one electrode pad has a plurality of bump electrodes provided thereon; and the at least one electrode pad is electrically connected to the at least one bonding pad via the conductive layer which is provided between the plurality of bump electrodes and the bonding pad facing the plurality of bump electrodes, where the conductive layer is an insulative material having conductive particles dispersed throughout;

wherein one of the plurality of bump electrodes has a height different from at least one other of the plurality of bump electrodes.

2. A liquid crystal display device according to claim 1, wherein a space between the adjacent bump electrodes is about 5 μm or more.

3. A liquid crystal display device according to claim 1, comprising a plurality of electrode pads, wherein:

each of the plurality of electrode pads has major sides and minor sides;

the plurality of electrode pads are aligned in a direction parallel to the minor sides of the electrode pads; and the plurality of bump electrodes are aligned on each of the plurality of electrode pads in a direction parallel to the major sides.

4. A liquid crystal display device according to claim 1, comprising a plurality of electrode pads, wherein the plurality of electrode pads are arranged in a zigzag manner, and corners of the bump electrodes are cut such that a cut corner of the bump electrode on one electrode pad is generally parallel to a cut corner of the bump electrode on an adjacent electrode pad.

5. A liquid crystal display device according to claim 1, wherein surfaces of the plurality of the bump electrodes facing the bonding pad are arranged so as to be generally parallel to a surface of the bonding pad.

6. A liquid crystal display device according to claim 1, comprising a plurality of electrode pads and a plurality of bonding pads facing the plurality of electrode pads, wherein electrical connection is provided between each of the plurality of bonding pads and a corresponding electrode pad via a single conductive layer made of an anisotropic conductive adhesive.

7. A liquid crystal display device according to claim 1, wherein the line pattern on the substrate and the circuit element are electrically connected to each other in a face bonding manner.

8. A liquid crystal display device according to claim 1, wherein the substrate is a glass substrate.

9. A liquid crystal display device according to claim 1, wherein any one of the plurality of bump electrodes is sufficient for carrying a current needed to complete an electrical connection, independently of any other of the plurality of bump electrodes, between the at least one electrode pad and the at least one bonding pad via the conductive layer.

10. A liquid crystal display device according to claim 1, wherein any one of the plurality of bump electrodes is of sufficient height to complete an electrical connection, independently of any other of the plurality of bump electrodes, between the at least one electrode pad and the at least one bonding pad via the conductive layer.

11. A liquid crystal display device according to claim 1, wherein less than the total number of bump electrodes comprising the plurality of bump electrodes is sufficient for carrying a current needed to complete an electrical connection between the at least one electrode pad and the at least one bonding pad via the conductive layer.

12. A liquid crystal display device according to claim 1, wherein less than the total number of bump electrodes comprising the plurality of bump electrodes is of sufficient height to complete an electrical connection between the at least one electrode pad and the at least one bonding pad via the conductive layer.

* * * * *